(12) United States Patent
Cho et al.

(10) Patent No.: US 10,147,836 B2
(45) Date of Patent: Dec. 4, 2018

(54) PRODUCTION OF THIN FILM SOLAR GRADE SILICON ON METALS BY ELECTRODEPOSITION FROM SILICON DIOXIDE IN A MOLTEN SALT

(71) Applicant: The Board of Regents of the University of Texas System, Austin, TX (US)

(72) Inventors: Sung Ki Cho, Austin, TX (US); Allen J. Bard, Austin, TX (US); Fu-Ren F. Fan, Austin, TX (US)

(73) Assignee: Board of Regents of the University of Texas System, Austin, TX (US)

( * ) Notice: Subject to any disclaimer, the term of this patent is extended or adjusted under 35 U.S.C. 154(b) by 716 days.

(21) Appl. No.: 14/404,746

(22) PCT Filed: May 31, 2013

(86) PCT No.: PCT/US2013/043604
§ 371 (c)(1),
(2) Date: Dec. 1, 2014

(87) PCT Pub. No.: WO2013/181528
PCT Pub. Date: Dec. 5, 2013

(65) Prior Publication Data
US 2015/0107657 A1 Apr. 23, 2015

Related U.S. Application Data

(60) Provisional application No. 61/653,872, filed on May 31, 2012.

(51) Int. Cl.
*C25B 1/00* (2006.01)
*C25B 1/26* (2006.01)
(Continued)

(52) U.S. Cl.
CPC ............ *H01L 31/1804* (2013.01); *C25D 3/56* (2013.01); *C25D 3/66* (2013.01); *C25D 9/08* (2013.01); *H01L 31/0288* (2013.01)

(58) Field of Classification Search
CPC ....... C25B 1/006; C25B 1/00; C25B 11/0421; C25B 1/26; C25B 9/00
(Continued)

(56) References Cited

U.S. PATENT DOCUMENTS 3,990,953 A 11/1976 Austin
4,142,947 A 3/1979 Cohen
(Continued)

FOREIGN PATENT DOCUMENTS

CN 101054675 10/2007
CN 101545111 9/2009
(Continued)

OTHER PUBLICATIONS

Chinese Office Action, Application No. 201380038742.7 dated May 18, 2016, 11 pages.
(Continued)

*Primary Examiner* — Zulmariam Mendez
(74) *Attorney, Agent, or Firm* — Meyertons, Hood, Kivlin, Kowert & Goetzel, P.C.; Mark R. DeLuca (57) ABSTRACT

A method of producing a silicon film includes: forming a deposition composition comprising silicon dioxide dispersed in a molten salt; placing a metal substrate and a counter electrode in the composition; and passing a reducing current between the metal substrate and the counter electrode, wherein the reducing current causes reduction of silicon dioxide particles to form a silicon film on the metal substrate.

20 Claims, 9 Drawing Sheets

(51) Int. Cl.
C25B 9/00 (2006.01)
H01L 31/18 (2006.01)
C25D 3/56 (2006.01)
C25D 3/66 (2006.01)
C25D 9/08 (2006.01)
H01L 31/0288 (2006.01)

(58) Field of Classification Search
USPC ........................................................ 205/410
See application file for complete search history.

(56) References Cited

U.S. PATENT DOCUMENTS 5,320,736 A 6/1994 Stickney et al.
2010/0202954 A1 8/2010 Yamada et al.

FOREIGN PATENT DOCUMENTS

| CN | 101935846 | 1/2011 |
| CN | 101979712 | 2/2011 |
| DE | 10108893 | 10/2002 |
| JP | 07-277721 | 10/1995 |
| JP | 2002146587 | 5/2002 |
| WO | 2002068719 | 9/2002 |
| WO | 2002099166 | 12/2002 |
| WO | 2010126597 | 11/2010 |

OTHER PUBLICATIONS

International Search Report/Written Opinion for PCT Application No. PCT/US2013/043604 dated Sep. 2, 2013.
International Preliminary Report on Patentability for PCT Application No. PCT/US2013/043604 dated Dec. 2, 2014.
Abedin et al. "Electropolymerization of benzene in a room temperature ionic liquid" Electrochem. Commun. 6 (2004) 510 (Abstract).
Al-Salman et al. "Electrodeposition of Ge, Si and SixGe1-x from an air- and water-stable ionic liquid" Phys. Chem. Chem. Phys. 10 (2008) (Abstract).
Afonichkin et al. "Dynamic reference electrode for investigation of fluoride melts containing beryllium difluoride" J. Fluorine Chem. 130 (2009) 83 (Abstract).
Agrawal et al. "Electrodeposition of Silicon from Solutions of Silicon Halides in Aprotic Solvents" J. Electrochem. Soc. 128 (1982) 2292 (Abstract).
Bieber et al. "Silicon electrodeposition in molten fluorides" Electrochimica Acta (2012), 62, 282-289.
Boen et al. "The electrodeposition of silicon in fluoride melts" J. Appl. Electrochem. 13 (1983) 277 (Abstract).
Borisenko et al. "In Situ STM Investigation of Gold Reconstruction and of Silicon Electrodeposition on Au(111) in the Room Temperature Ionic Liquid 1-Butyl-1-methylpyrrolidinium Bis(trifluoromethylsulfonyl)imide" J. Phys. Chem. B 110 (2006) 6250 (Abstract).
Chen et al. "Voltammetric Studies of the Oxygen-Titanium Binary System in Molten Calcium Chloride" J. Electrochem. Soc. 149 (2002) E455 (Abstract).
Christophersen et al. "Crystal orientation and electrolyte dependence for macropore nucleation and stable growth on p-type Si." Materials Science and Engineering: B 69 (2000): 194-198.
Cohen et al. "Some prospective applications of silicon electrodeposition from molten fluorides to solar cell fabrication" J. Electron. Mater. 6 (1977) 607 (Abstract).
Dring et al. "Voltammetry of Titanium Dioxide in Molten Calcium Chloride at 900°C" J. Electrochem. Soc. 152 (2005) E104 (Abstract).
Elwell et al. "Mechanism of electrodeposition of silicon from K2SiF6-flinak" Electrochim. Acta 27 (1982) 673 (Abstract).
Ema et al. "Relation between potentials of Li,K/Li+,K+ dynamic reference electrode and HF/H2 gas electrode in a molten LiF-KF system" Electrochim. Acta 32 (1987) 1537 (Abstract).

Ergul et al. "Electrochemical decomposition of SiO2 pellets to form silicon in molten salts" Journal of Alloys and Compounds (2010), 509(3), 899-903 (Abstract).
Ergul et al. "Reduction of Porous Silica Pellets by Electrodeoxidation in Molten Salts" Materials Research Society Symposium Proceedings (2010), 1210(Photovoltaic Materials and Manufacturing Issues II), No pp. given, Paper #: 1210-Q08-17 (Abstract).
Feigelson "Crystal growth by the electrolysis of molten salts" Advances in Chemistry Series (1980), 186(Solid State Chem.: Contemp. Overview), 243-75 (Abstract).
Frazer et al. "A galvanostatic study of the electrolytic reduction silica in molten cryolite" Electrochim. Acta 22 (1977) 1179 (Abstract).
Gass et al. "Low-cost substrates for polycrystalline-silicon solar cells by electrodeposition processes" NASA Quarterly Progress Report, Oct. 1-Dec. 31, 1979 Westinghouse Research and Development Center, Pittsburgh, PA. Physical and Organic Chemistry (Abstract).
Gobet "Electrodeposition of Silicon from a Nonaqueous Solvent" J. Electrochem. Soc. 135 (1988) 109-112 (Abstract).
Jin et al. "Electrochemical preparation of silicon and its alloys from solid oxides in molten calcium chloride" Angewandte Chemie, International Edition (2004), 43(6), 733-736.
Juzeliunas et al. "Silicon surface texturing by electro-deoxidation of a thin silica layer in molten salt" Electrochem. Commun. 12 (2010) 1270 (Abstract).
Katayama "Preparation of a novel fluorosilicate salt for electrodeposition of silicon at low temperature" Electrochemistry (Tokyo, Japan) (2001), 69(11), 834-836 (Abstract).
Kobayashi et al. "Direct Electrolytic Reduction of Powdery SiO2 in Molten CaCl2 with Pellet-Type SiO2 Contacting Electrodes" ECS Transactions (2010), 33(7, Molten Salts and Ionic Liquids 17), 239-248 (Abstract).
Laser et al "Semiconductor Electrodes. IV. Electrochemical behavior of n-and p-type silicon electrodes in acetonitrile solutions" (1976) The Journal of Physical Chemistry, 80(5), 459-466.
Lee et al. "Silicon powder production by electrochemical reduction of SiO2 in molten LiCl—Li2O" Journal of Industrial and Engineering Chemistry (2008), 14(5), 651-654 (Abstract).
Li et al. "Study on foundation of electrodeposited silicon in fused salts" Youse Jinshu, Yelian Bufen (2004), (3), 23-26 (Abstract).
Li et al. "Electrocrystallization mechanism of silicon in molten salts" Youse Jinshu (2005), 57(2), 66-68, 87 (Abstract).
Liu et al. "Study on solar grade silicon preparation directly by molten salt electrolysis" Youse Jinshu, Yelian Bufen (2008), (2), 31-33 (Abstract).
Moore et al. "Fused-salt electrodeposition of thin-layer silicon" Conference Record of the IEEE Photovoltaic Specialists Conference (1997), 26th, 775-778.
Munisamy et al. "Electrodeposition of Si from organic solvents and studies related to initial stages of Si growth" Electrochem. Acta 55 (2010) 3797 (Abstract).
Nakagawa et al. "Electrogenerated IrOx Nanoparticles as Dissolved Redox Catalysts for Water Oxidation" J. Am. Chem. Soc., 2009, 131 (43), pp. 15578-15579.
Nicholson et al. "Electrodeposition of Silicon from Nonaqueous Solvents" J. Electrochem. Soc. 152 (2005) C795 (Abstract).
Nishimura et al. "Direct Electrolytic Reduction of Amorphous SiO2 Powder Refined from Diatomaceous Earth" Transactions of the Materials Research Society of Japan vol. 35 (2010) No. 1 p. 47-49 (Abstract).
Nohira et al. "Pinpoint and bulk electrochemical reduction of insulating silicon dioxide to silicon" Nature Materials 2, 397-401 (2003) (Abstract).
Nohira "Direct electrolytic reduction from silica to silicon in molten salts" Yoyuen oyobi Koon Kagaku (2011), 54(3), 95-103 (Abstract).
Oishia "Process for Solar Grade Silicon Production by Molten Salt Electrolysis Using Aluminum-Silicon Liquid Alloy" Journal of the Electrochemical Society (2011), 158(9), E93-E99 (Abstract).
Osen et al. "Electrodeposition of Crystalline Silicon Films from Alkali Fluoride Mixtures" ECS Transactions 33, No. 7 (2010): 429-438 (Abstract).

(56) References Cited

OTHER PUBLICATIONS

Rao et al. "Electrowinning of silicon from potassium hexafluorosilicate-molten fluoride systems" Journal of the Electrochemical Society (1980), 127(9), 1940-4 (Abstact).

Rao et al. "Electrocoating of silicon and its dependence on the time of electrolysis" Surface Technology (1981), 13(4), 331-7 (Abstract).

Roan et al. "Solid Oxide Membrane Process for Solar Grade Silicon Production Directly from Silicon Dioxide" TMS 2011, Annual Meeting & Exhibition, Supplemental Proceedings, 140th, San Diego, CA, United States, Feb. 27-Mar. 3, 2011 (2011), 1, 717-721 (Abstract).

Srivastava et al. "Electrical Conductivity of Silicon Dioxide Thermally Grown on Silicon" J. Electrochem. Soc. 132 (1985) 955 (Abstract).

Stern et al. "Electrodeposition of silicon from molten salts" Thin Solid Films (1985), 124(2), 129-34 (Abstract).

Wendt et al. "Cathodic deposition of refractory intermetallic compounds from flinak-melts—I. Voltammetric investigation of Ti, Zr, B, TiB2 and ZrB2" Electrochim. Acta 37 (1992) 237 (Abstract).

Xiao et al. "Rationalisation and optimisation of solid state electro-reduction of SiO2 to Si in molten CaCl2 in accordance with dynamic three-phase interlines based voltammetry" J. Electroanal. Chem. 639 (2010) 130 (Abstract).

Yang et al. "Electrochemical preparation of silicon nanowires from nanometre silica in molten calcium chloride" Chemical Communications (Cambridge, United Kingdom) (2009), (22), 3273-3275 (Abstract).

Yang et al. "Effect of frequency on composition and microstructure of siliconized layer using pulse electrodeposition" Advanced Materials Research (Zuerich, Switzerland) (2011), 189-193(Pt. 2, Manufacturing Process Technology), 1113-1116 (Abstract).

Yasuda et al. "Effect of electrolysis potential on reduction of solid silicon dioxide in molten CaCl2" Journal of Physics and Chemistry of Solids vol. 66, Issues 2-4, Feb.-Apr. 2005, pp. 443-447 (Abstract).

Yasuda et al. "Mechanism of Direct Electrolytic Reduction of Solid SiO2 to Si in Molten CaCl2" Journal of the Electrochemical Society (2005), 152(4), D69-D74 (Absract).

Yasuda et al. "Si production by direct electrolytic reduction of solid SiO2 in molten CaCl2" Proceedings—Electrochemical Society (2006), 2004-24(Molten Salts XIV), 999-1005.

Yasuda et al. "Direct electrolytic reduction of solid SiO2 in molten CaCl2 for the production of solar grade silicon" Electrochimica Acta (2007), 53(1), 106-110 (Abstract).

Yasuda et al "Direct Electrolytic Reduction of Solid Silicon Dioxide in Molten LiCl—KCl—CaCl2 at 773 K" J. Electrochem. Soc. 152 (2005) D208 (Abstract).

Zhao et al. "Direct preparation of Si from SiO2 by SOM process" Cailiao Kexue Yu Gongyi (2011), 19(2), 113-117 (Abstract).

PRODUCTION OF THIN FILM SOLAR GRADE SILICON ON METALS BY ELECTRODEPOSITION FROM SILICON DIOXIDE IN A MOLTEN SALT

BACKGROUND OF THE INVENTION

1. Field of the Invention

The invention generally relates to methods of forming high purity silicon. More specifically, the invention relates to electrochemical formation of silicon from silicon oxide nanoparticles.

2. Description of the Relevant Art

Currently there is a high demand and consumption of silicon as a material for photovoltaic (PV) devices. Most photovoltaic devices are based on the crystalline silicon p-n junction, and accordingly, the price of silicon has a great effect on the cost of these devices. The purity of silicon required for photovoltaic devices, which is called 'solar silicon', is 99.9999% (6N), which is less pure than that for electronics applications (11N). There is therefore a strong interest in developing a low cost production processes for solar silicon, compared to conventional high purity silicon production process such as the Siemens process, especially a process that can produce thin films of needed purity and crystallinity directly. Generally, high purity silicon is produced by the carbothermic reduction of $SiO_2$ with carbon at 2000° C. followed by the purification with HCl at 1000° C. These processes are highly energy-consuming with considerable emission of $CO_2$.

Electrochemical approaches for producing silicon have been studied; these are attractive because they could lead to a less expensive route to produce solar Si. In general, an electrochemical apparatus is simpler than that for vacuum processes and it is easier to control the process variables. Since the $Si/SiO_2$ couple has a very negative potential for reduction and Si can be easily oxidized, the electrochemical formation of silicon is usually carried out in non-aqueous solutions. Many studies on silicon electro deposition have been carried out in organic solvents or room temperature ionic liquids, where silicon halide compounds such as $SiCl_4$ and $SiHCl_3$ are usually used as precursors. However, the silicon deposits obtained were coarse and impure. Moreover, the silicon was so porous that it was easily oxidized, and so far, has been unsuitable for use as solar silicon. Another choice for electrolyte for depositing silicon is a high temperature molten salt. $LiF/KF/K_2SiF_6$ (at 745° C.) has been investigated and is said to be capable of growing relatively pure (up to 4N) crystalline silicon. However there are issues about the low deposition rate, which is an important consideration in a manufacturing process and the safety in handling fluoride compounds. It is also possible to make silicon from alkali or alkaline earth silicate melts such as $BaO—SiO_2—BaF_2$ and $SrO—SiO_2—SrF_2$ (at 1465° C.). The extremely high operating temperature results in high-energy consumption, which leads to the formation of liquid silicon which is mixed with the melt and makes their separation difficult.

More recently, it has been reported that solid $SiO_2$ can be electrochemically reduced to crystalline silicon in a calcium chloride melt. In a $CaCl_2$ melt, electrons can be transferred from a metal (molybdenum, tungsten, or nickel) cathode directly to a mechanically contacted solid quartz piece. The reduction reaction starts at metal/electrolyte/metal oxide three-phase interface and the oxygen ion is removed from the solid structure.

$$SiO_2(s)+4e^-\rightarrow Si(s)+2O^{2-} \tag{1}$$

This seems to be a promising approach, because silicon dioxide is a cheap and abundant source material and the operating conditions are less severe than those for other molten salt systems.

SUMMARY OF THE INVENTION

A method of producing a silicon film includes: forming a deposition composition comprising silicon dioxide dispersed in a molten salt; placing a metal substrate and a counter electrode in the composition; and passing a reducing current between the metal substrate and the counter electrode, wherein the reducing current causes reduction of silicon dioxide particles to form a silicon film on the metal substrate. In an embodiment, the metal substrate is a silver substrate.

The silicon dioxide particles may have an average diameter of less than 50 μm, or an average diameter of less than 1 μm. The silicon dioxide particles may be in the form of a colloid of silicon oxide particles in water.

The molten salt includes one or more Group I or Group II salts. In some embodiments, the molten salt includes one or more Group I or Group II chloride salts. Exemplary salts that may be used include, but are not limited to, calcium chloride, lithium chloride, potassium chloride or mixtures thereof. The molten salt is maintained at a temperature of less than about 1000° C.

In some embodiments, at least a portion of the metal substrate may be oriented in a substantially horizontal position.

Doped silicon films may be formed by adding a suitable oxidized form of a doping agent to the deposition composition. Suitable dopants include Group IIIb (Group 13) elements for forming p-type silicon films. Group Vb (Group 15) elements may be used to form n-type silicon films. In an embodiment, the deposition composition includes a boron compound, an arsenic compound, a phosphorus compound, an aluminum compound, an indium compound, an antimony compound, a bismuth compound, or mixtures thereof, to produce a doped silicon film on the metal substrate.

In a specific embodiment, the deposition composition includes aluminum oxide. Passing a reducing current between the silver substrate and the counter electrode, causes reduction of silicon dioxide particles and aluminum oxide to form an aluminum doped silicon film on the silver substrate.

In another embodiment, the deposition composition includes indium oxide. Passing a reducing current between the silver substrate and the counter electrode, causes reduction of silicon dioxide particles and indium oxide to form an indium doped silicon film on the silver substrate.

In another embodiment, the deposition composition includes antimony oxide. Passing a reducing current between the silver substrate and the counter electrode, causes reduction of silicon dioxide particles and antimony oxide to form an antimony doped silicon film on the silver substrate.

In another embodiment, the deposition composition includes bismuth oxide. Passing a reducing current between the silver substrate and the counter electrode, causes reduction of silicon dioxide particles and bismuth oxide to form a bismuth doped silicon film on the silver substrate.

The silicon coated metal substrates formed according to the above-method may be used in a variety of devices, including photovoltaic devices.

BRIEF DESCRIPTION OF THE DRAWINGS

Advantages of the present invention will become apparent to those skilled in the art with the benefit of the following detailed description of embodiments and upon reference to the accompanying drawings in which:

FIG. 9(a) depicts an SEM image of silicon crystal probed by tungsten tips and FIG. 9(b) I-V curves measured on silicon crystal with tungsten tips;

FIG. 9(c) depicts Mott-Schottky plot of silicon crystals measured in acetonitrile which contains 0.1 M TBAPF$_6$ (5333 Hz); and FIG. 9(d) depicts doping density estimated from I-V measurement and Mott-Schottky plot.

While the invention may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF THE PREFERRED EMBODIMENTS

It is to be understood the present invention is not limited to particular devices or methods, which may, of course, vary. It is also to be understood that the terminology used herein is for the purpose of describing particular embodiments only, and is not intended to be limiting. As used in this specification and the appended claims, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

In this description, we show that one can produce a silicon layer on a metal substrate from SiO$_2$ nanoparticles or microparticles added into the molten electrolyte salt.

Generally, the process is accomplished by forming a melt of the electrolyte and the silicon oxide particles. The melt is treated with a reducing current between the metal substrate (which serves as the working electrode) and a counter electrode. The counter electrode is a carbon based electrode (e.g., a glassy carbon electrode or a graphite rod). During reduction, silicon dioxide is reduced to silicon which is deposited onto the metal substrate to form a silicon film on the surface of the metal substrate. The silicon film, in some embodiments, has a purity of at least about 99.9999%. While any suitable metal substrate may be used, it was found that the process is particularly useful for the formation of a silicon film on a silver substrate. The resulting silicon coated metal substrate may be used in a variety of applications, including use as a photovoltaic device.

The silicon dioxide particles may have an average diameter of less than 50 μm, or an average diameter of less than 1 μm. The silicon dioxide particles may be in the form of a colloid of silicon oxide particles in water. Addition of the colloidal silicon oxide to the molten salt causes the water to be driven from the colloidal silicon oxide composition to form a suspension of silicon dioxide in the molten salt.

The molten salt may be formed from any ionic compound. In an embodiment, Group 1a and Group 2a chloride salts are used to form the molten salt. Specific examples of Group 1a and Group 2a chloride salts that may be used include calcium chloride, lithium chloride, potassium chloride and mixtures thereof. Generally the molten salt used has a melting point of less than about 1000° C. For salts that have a melting point above 1000° C., eutectic mixtures of salts may be used to create a composition that melts below 1000° C.

The properties of the deposited silicon film may be altered by adding a dopant to the silicon film. In an embodiment, a dopant may be formed by co-reduction of a suitable oxidized dopant during silicon deposition. For example, a dopant oxide may be added to the composition, the dopant oxide being reduced by the same reducing current used to reduce the silicon dioxide, to provide a doped silicon film. This technique of preparing a doped silicon film leads to doped films that are substantially free of defects, with the dopant homogenously dispersed throughout the film.

Typical silicon dopants may be integrated into the silicon film in this manner. Group IIIb (Group 13) elements may be used to create a p-type silicon film. Examples of Group IIIb elements that may be used include, but are not limited to, boron, aluminum, gallium, and indium. These dopants may be added to the deposition composition in the form of oxides. For example, to create a p-type silicon film, boron oxide, aluminum oxide, gallium oxide, or indium oxide is added to the deposition composition. Group Vb (Group 15) elements may be used to create an n-type silicon film. Examples of Group Vb elements that may be used include, but are not limited to, phosphorus, arsenic, antimony, and bismuth. These dopants may be added to the deposition composition in the form of oxides. For example, to create an n-type silicon film, phosphorus oxide, arsenic oxide, antimony oxide, or bismuth oxide is added to the deposition composition.

Figure 1:
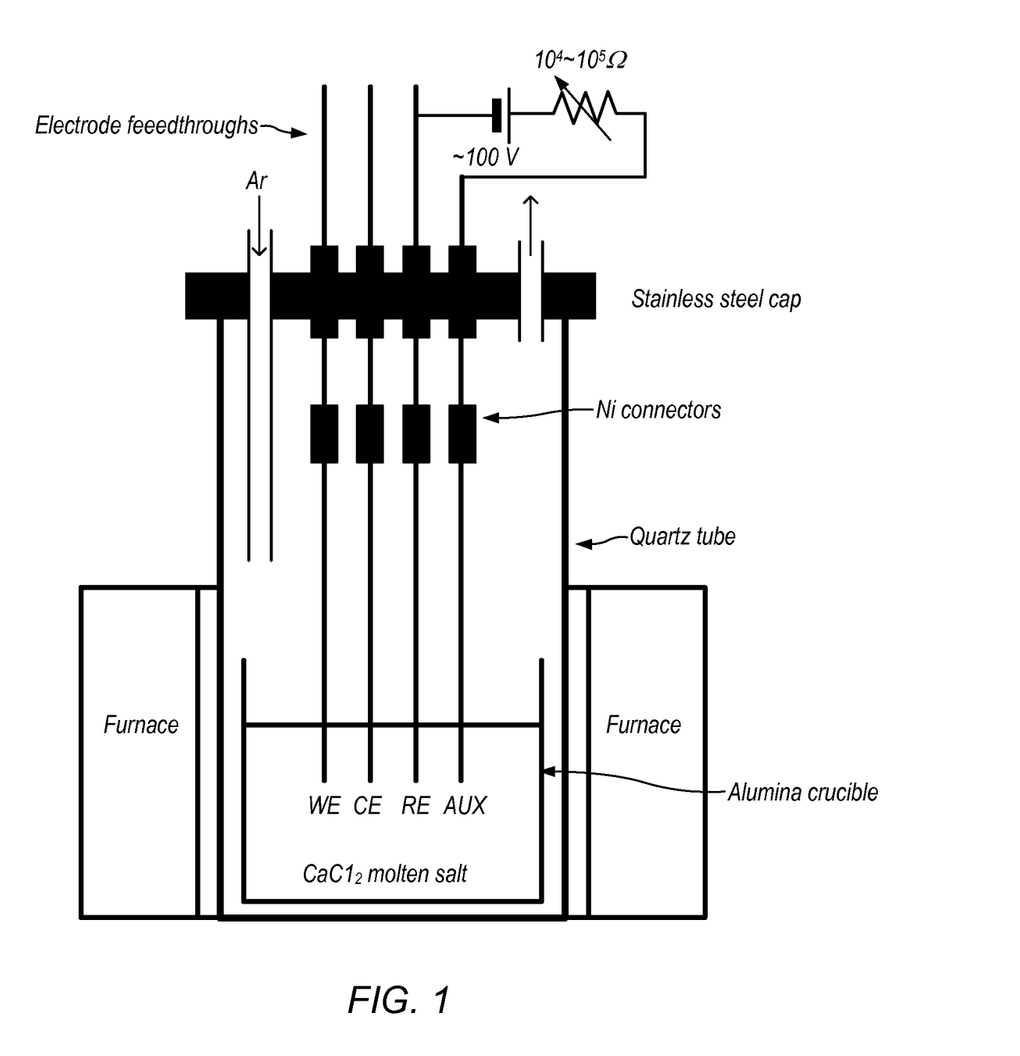
FIG. 1 is a schematic diagram of an electrochemical cell.

FIG. 1 depicts a schematic diagram of a device used to form a silicon film on a metal substrate. In an embodiment, the electrochemical reduction is performed in a quartz tube electrochemical cell. A 40 cm long quartz tube (5 cm dia.) with one open end was closed with a 316 stainless steel cap, using an O-ring and clamp. The stainless steel cap has electrode feedthroughs and in- and outlet valves for Ar gas. The electrode feedthroughs were fabricated with 316 stainless steel tube fittings (Swagelok, Essex Junction, Vt.) combined with 0.1 cm dia. 304 stainless steel wires, which were coated with heat shrinkable Teflon tubes (Zeus, Gaston, S.C.) to insulate electrodes from the tube fittings. The working electrode feedthrough was made of stainless steel wire with a rubber stopper that facilitates the vertical movement of the electrode inside the closed tube cell. This made it possible to maintain the electrode above the molten salt and only insert the electrode into the $CaCl_2$ after it melted and to remove the electrode from the melt after the electrochemical reaction is finished and hold it in the inert atmosphere. All connecting points on feedthroughs were covered with a vacuum seal (Varian, Milpitas, Calif.) to prevent air from entering the cell. An inert gas (e.g., Ar gas) was fed into the cell through a 20 cm long 304 stainless steel tube, which was connected with a stainless steel ball valve (Swagelok, Essex Junction, Vt.) and was vented via a stainless steel bleed valve (Swagelok, Essex Junction, Vt.). All electrodes were connected to the feedthroughs via homemade nickel line connectors and a nickel clamp. The quartz tube assembled with a stainless steel cap was inserted into the vertical tube furnace (21100, Barnstead/Thermolyne, Dubuque, Iowa) and heated to the appropriate temperature at increments of 10° C./min. Electrochemical analyses and depositions were performed under argon gas (99.9995%, Praxair, Inc., Danbury, Conn.) over the melt.

The molten salt is formed from a solid salt that is dried before use. In an embodiment, the salt is dried in a vacuum oven at about 200° C. for a time sufficient to remove most of the water before melting. The molten salt may be calcium chloride dihydrate ($CaCl_2 \cdot 2H_2O$, >99%, Sigma-Aldrich, St. Louis, Mo.), but higher purity $CaCl_2$ would also be appropriate. Heating the salt may remove most of the water that is bound chemically and physically to the salt.

In an example, the quartz tube, assembled with a stainless steel cap, was inserted into a vertical tube furnace and heated to 850° C. at increments of 10° C. per min. Argon gas flowed over the melt during the electrolysis. Calcium chloride dehydrate, which was dried in vacuum at 200° C. for over 6 h was used as an electrolyte. The dried calcium chloride was placed in a cylindrical alumina crucible at the bottom of a quartz tube in a furnace. The silicon precursor was colloidal nanometer-sized silicon dioxide (5~15 nm). The working electrode was a 0.025 cm thick silver foil. The counter electrode was glassy carbon or a graphite rod. The reference electrode is graphite as a quasi-reference electrode. After the experiments were finished, the whole cell was cooled slowly (~2° C./min) under Ar flow and the working electrode was cleaned and sonicated in water.

The choice of reference electrode is not trivial for electrochemistry in high temperature molten salts. In an embodiment, a dynamic $Ca/Ca^{2+}$ reference electrode may be used. This was made by cathodically polarizing a metal wire with respect to an auxiliary electrode by connecting it to a battery (to prevent interaction with the potentiostat) and a resistor, as shown in FIG. 1, to continually generate Ca at a current density of about 10 $mA/cm^2$. By controlling this current, we can define and fix the potential of the reference electrode. In the $CaCl_2$ melt, the reduction of calcium ion occurs on the cathodically polarized metal electrode, and chlorine gas is generated on the carbon auxiliary electrode. An exemplary adjustable resistor that may be used is in the range of 104-105Ω, which is much higher than the resistance of the $CaCl_2$ melt and the reaction resistance of the $Ca^{2+}$ reduction. Therefore the current passing through the metal electrode is determined by this resistor. The current on the reference electrode was monitored with a multimeter by measuring the potential drop across the resistor. The dynamic reference electrode was stable for more than 8 h within ±5 mV. When the $CaCl_2$ melts containing $SiO_2$ nanoparticles were used, the reference electrode was a graphite quasi-reference electrode, and all potentials were later calibrated and are reported with respect to the $Ca/Ca^{2+}$ dynamic reference electrode.

The choice of the working electrode material is important in obtaining a photoactive Si deposits. For example poor deposits are formed on Si, Mo, and carbon, which form alloys (e.g., silicides with silicon) easily. However silver, as in this example, produces photoactive deposits. One difference between a poor and a good working electrode material (i.e., deposition substrate) is the melting point, since materials with lower melting points have greater mobility of the surface atoms allowing the deposit to form in a crystalline Si structure, different than the substrate structure. Besides, Ag does not form silicides with silicon.

SEM images show that Ag islands exist on the Si deposit when an Ag deposition substrate is used to form the photoactive Si deposits. The formation of Ag islands and Si growth are known in the vapor-liquid-solid mechanism of single crystal silicon growth by chemical vapor deposition (CVD). The growth of Si electrodeposited from $SiO_2$ particles can be interpreted in a similar way. In the early stage of electrodeposition, the reduction creates the Ag—Si liquid drops since there is a eutectic point between Si and Ag (Ag 89 wt. % and Si 11 wt. %), and the operating temperature (850° C.) is slightly above the eutectic temperature (835° C.), as well as solid Si deposit. The Ag droplets function as reaction sites, and the following reduction leads to supersaturation of Si in the droplet followed by precipitation and growth of the pure Si phase. Contrary to the CVD process, electrodeposition requires the continuous supply of electrons passing through the deposit and this is possible because of the increase in the conductivity of Si at high temperature (ρ>0.05 Ω·cm at around 800° C.); this is due to an increase in the carrier density and degeneracy. In general, electrodeposition proceeds by nucleation, followed by growth and the formation of the continuous film on the substrate and these recur on the deposit surface for continuous film growth. In the case of Si electrodeposition from $SiO_2$, however, the Si surface itself is not good for the nucleation step and the film formation of Si deposit, and therefore, the generation of an Ag droplet contributes to the continuous growth of silicon.

Figure 2:
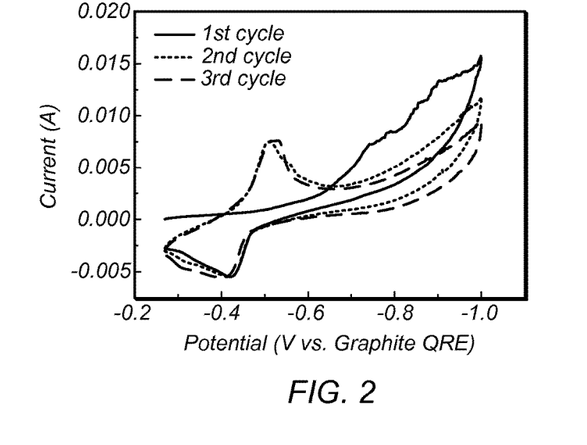
FIG. 2 depicts cyclic voltammograms on Ag foil (0.35 cm$^2$) in 850° C. CaCl$_2$ molten salt which contains a 0.2 M SiO$_2$ nanoparticle suspension.

Cyclic voltammetry and constant current electrolysis were carried out with an Eco Chemie Autolab PGSTAT30 potentiostat (Utrecht, Netherlands). The length of the working electrode immersed in the electrolyte was 0.7 cm. FIG. 2 shows the result of cyclic voltammetry on silver (0.35 $cm^2$) in an 850° C. $CaCl_2$ melt which contained a 0.2 M $SiO_2$ nanoparticle suspension. During a negative potential scan, new surface-related oxidation and relevant reduction peaks evolved, which indicated the formation of a silicon layer on the silver surface during the initial forward scan and silicon oxidation peaks at the surface on the backward scan. The electrodeposition should be carried out at potentials where no elemental Ca can deposit and contaminate the Si.

Figure 3:
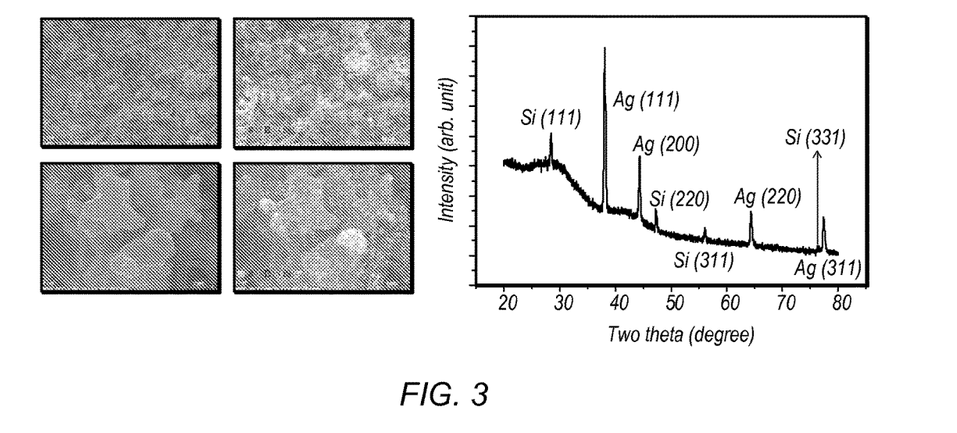
FIG. 3 depicts an SEM image and X-ray diffraction of Si deposit on Ag after electrolysis (5 mA/cm$^2$, 18000 s)

The Si deposit was examined with a scanning electron microscope (SEM, Quanta 650 FEG, FEI Company, Inc., Hillsboro, Oreg.). The composition and crystallinity of the Si deposit were characterized by energy dispersive spectroscopy (EDS) (XFlash® Detector 5010, Bruker, Fitchburg, Wis.) and X-ray diffractometry (XRD) with a D8 ADVANCE (Bruker, Fitchburg, Wis.) equipped with a Cu Kα radiation source. FIG. 3 exhibits the scanning electron microscope (SEM) image of the silicon deposit on silver after electrolysis. Energy dispersive spectroscopy (EDS) elemental mapping revealed that almost the whole silver surface (yellow) was covered by silicon (blue), which is in form of platelets with dimensions of roughly 2 to 10 μm. A high magnification image of the silicon showed the well-defined crystalline plane of the silicon with a small silver residue on the surface. EDS analysis showed that the deposit of silicon was very pure with a small amount of silver, and the amounts of other elements were under the detection limit (<1 at %). The x-ray diffraction (XRD) pattern indicated that the silicon deposit has a polycrystalline structure.

Figure 4:
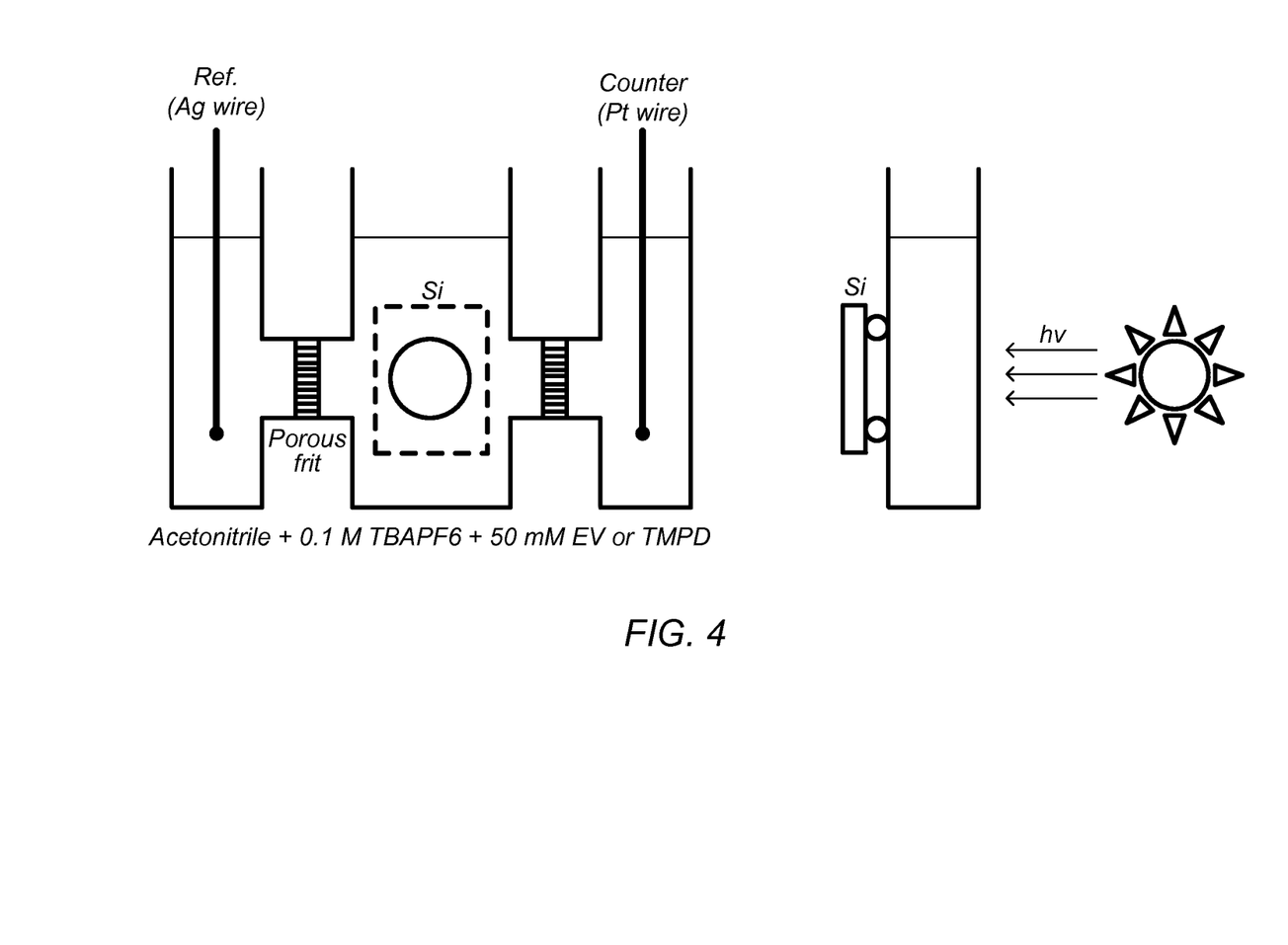
FIG. 4 is a schematic diagram of a photoelectrochemical cell for measurement of Si photoactivity.
Figure 5:
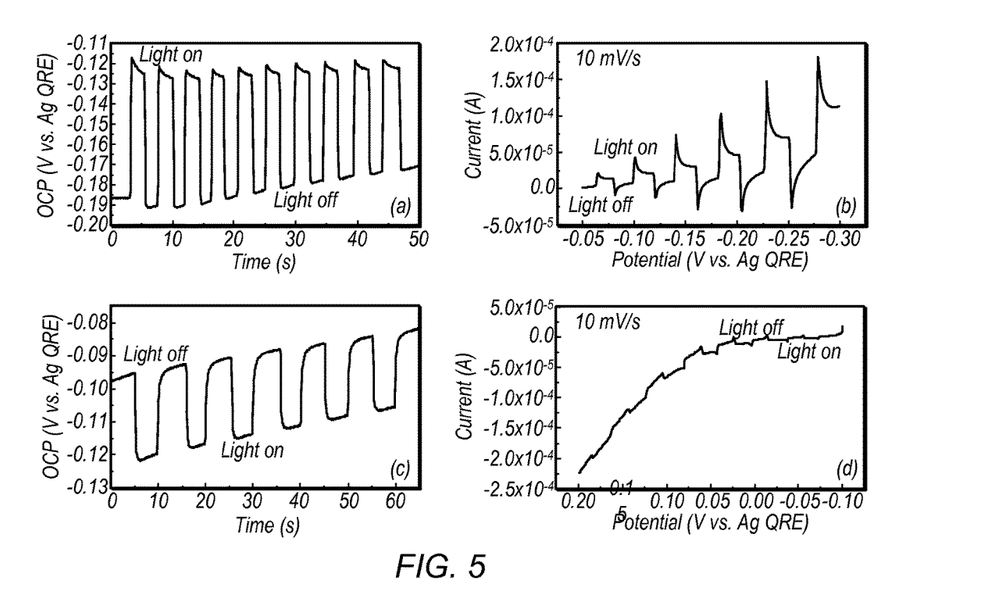
FIG. 5 depicts the change in the open circuit potential and linear sweep voltammograms of silicon deposit in acetonitrile solution containing (a, b) ethyl viologen (EV) or (c, d) N,N,N',N'-tetramethyl-p-phenylenediamine (TMPD) with UV, visible and near-infrared irradiation.

Photoactivity is an important characteristic of silicon as a solar material and demonstrates sufficient purity and applicability for solar photovoltaics. Photoresponse can be measured in a variety of ways, e.g. by construction of a photovoltaic cell. In an embodiment, photoelectrochemical (PEC) testing can be used as a good predictor of photovoltaic behavior. FIG. 4 is a schematic diagram of photoelectrochemical cell for the measurement of photoactivity. The photoresponse of the silicon deposit was measured in a non-aqueous liquid electrolyte (e.g. acetonitrile) with either a reducible reagent (such as ethyl viologen) for a p-type material or an oxidizable reagents (such as N,N,N',N'-tetramethyl-p-phenylenediamine, TMPD) for an n-type materials, whose reaction potentials are within the band gap of silicon. Immersion of silicon deposit in the electrolyte results in the formation of semiconductor-liquid junction, and the change of the potential and the production of an appreciable redox reaction current by the illumination of light can be detected. FIG. 5 shows the change in the open circuit potential (vs. Ag QRE) and the linear sweep voltammetry of silicon deposited on silver according to xenon lamp irradiation (100 mW/$cm^2$). In FIG. 5A, the open circuit potential of silicon deposition in 100 mM EV solution shifted in the positive direction under irradiation, which indicates this silicon deposit is p-type. A recording of the photocurrent for the photo-reduction of EV as a function of applied potential is shown in FIG. 5B. On the other hand, n-type silicon could also be obtained from the electrolysis. A different deposit of Si on Ag produced under a flowing Fe-containing gas can produce a donor level in the silicon; this Si showed a negative shift in the open circuit potential (FIG. 4C) and the photo-oxidation of TMPD (FIG. 4D).

Doping of a semiconductor, to produce either p- or n-type material is based on the introduction of very small (ppm) amounts of impurities. For Si in electronics application these are often B for p-type and As or P for n-type, although a wide variety of impurities can be used. The differences in the doping characteristics of deposited silicon shown here probably result from small changes in the electrolysis conditions and trace impurities in the $CaCl_2$ and $SiO_2$ employed. However the ability to dope to produce either type is important and suggests it may be possible to form p-n junctions by the electrochemical technique.

Dependence of the Properties of Silicon Deposit on the Characteristics of $SiO_2$ Particle Precursor We have tested various types of $SiO_2$ particles in terms of size (10 nm to 45 μm), impurity, crystal structure (amorphous or cristobalite) from different providers, for silicon electrodeposition (Table 1) and found out that photoactive polycrystalline silicon deposits can be universally obtained. Their photoactivity is obvious but weak in most cases, indicating that silicon deposit did not have a proper dopant and was probably close to intrinsic condition.

TABLE 1

The properties of various $SiO_2$ particles and corresponding silicon deposits

| | Purity (%) | total impurity (analyzed, ppm) | Impurity (analyzed, ppm) | Size (nm) | size (analyzed, nm) | surface area ($m^2$/g) | crystal structure | dopant | provider | deposited silicon type |
|---|---|---|---|---|---|---|---|---|---|---|
| Nano-powder | 99.5 | 643 | Al, Ba, Ti | 5-15 | 5 (TEM) | 590-690 | amorphous, porous | | Sigma-Aldrich | p, weak n, p |
| Nano-powder | 99.5 | 3400 | Al, Ca, Na | 10-20 | <20 (BET) | | amorphous | | Sigma-Aldrich | weak n, p |
| Quartz sand | 99.5 | 5758 | | <45 um | 1.5 um to 45 um | | Cristobalite | | Sigma-Aldrich | p |
| Nano-powder | 99.8 | 2.4 | B | 12 | | 204 | amorphous | | Sigma-Aldrich | n, weak n, p |
| Alumina doped silica | 99.99 | 8.6 | Ca | 50 | <50 | | amorphous | Al2O3 7.5 wt % | Sigma-Aldrich | n |
| Silica | 99.9 | 1 | Co (0.8), Fe (0.2) | 80 | | | amorphous | | Alfa | p |
| Nano-powder | 99.5 | <140 | Sr (40), Cr (40) | 10-20 | | | amorphous | | Alfa | n, weak n, p |

Figure 6:
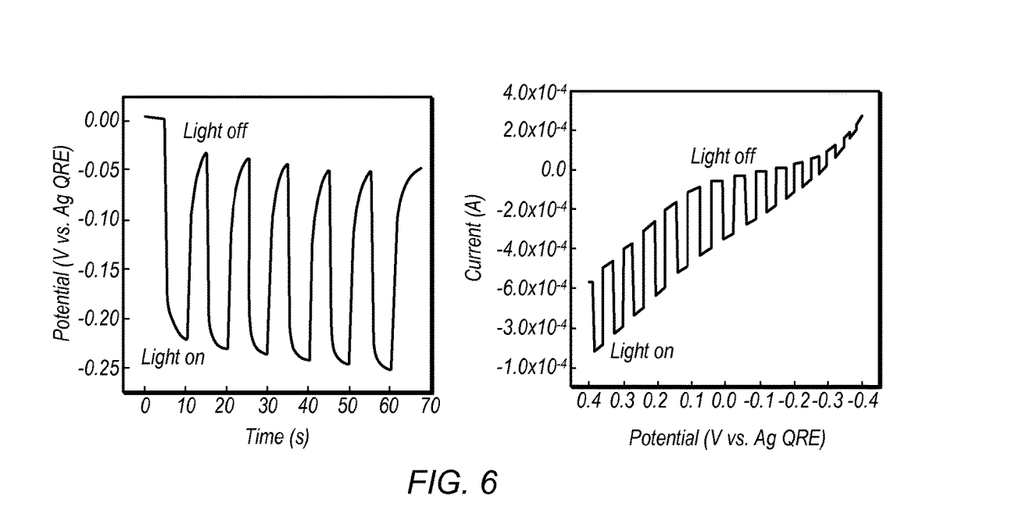
FIG. 6 depicts the change in the open circuit potential and linear sweep voltammograms of silicon deposited from Al-doped silica in acetonitrile solution containing 50 mM TMPD with UV irradiation.

In addition, the use of initially doped $SiO_2$ particles was found to produce extrinsic silicon. For example, silicon deposited from aluminum-doped silica, 7.5 wt % $Al_2O_3/SiO_2$) exhibited a strong n-type response in PEC cell. FIG. 6 depicts the change in the open circuit potential and linear sweep voltammograms of silicon deposited from Al-doped silica in acetonitrile solution containing 50 mM TMPD with UV irradiation.

Figure 7:
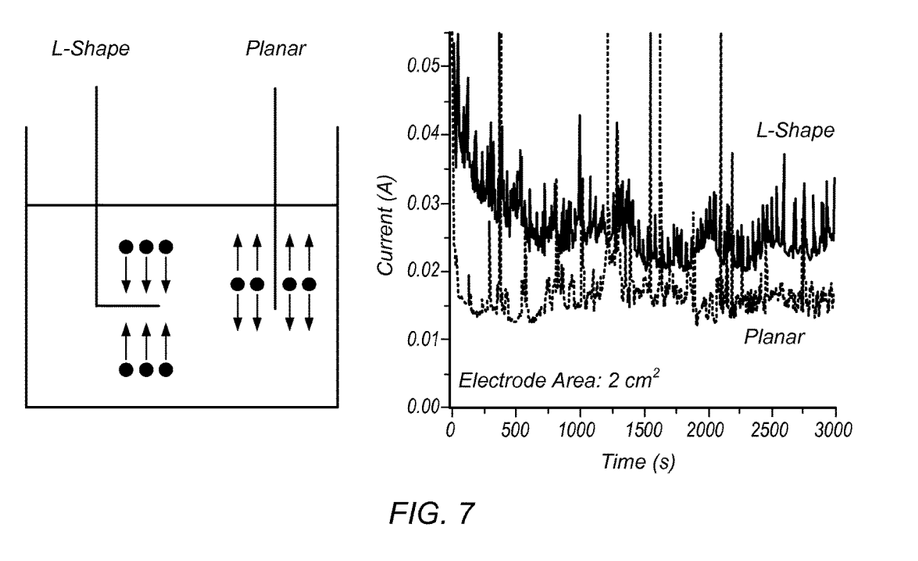
FIG. 7 depicts a schematic diagram of moving silica particle near the substrates with different shape and chronoamperograms at a silver electrode (−1.25 V vs. a quasireference electrode, QRE) in a 850° C. CaCl$_2$ melt containing a suspension of 0.2 M SiO$_2$ NPs.

$SiO_2$ Particle Dispersion in $CaCl_2$ Melt and the Consideration on Ag Electrode Geometry Understanding of dispersion and movement of $SiO_2$ particles in the melt is important to obtain a uniform silicon deposit. Although the initial distribution of the particles is uniform in melt, they would start to float on the melt surface or settle down on the bottom of reactor crucible. Because of the strong thermal convection inside of $CaCl_2$ melt originating from large temperature differences between top (cooling by Ar flow) and bottom (heating by furnace), suspended particles start to move upward to the melt surface. In addition, the density of $SiO_2$ particle (2.2 g/ml) is similar to that of molten $CaCl_2$ (2.08 g/ml) whereby particles keep floating. On the other hand, $SiO_2$ particles have large thermal energy, which is transferred from high temperature melt so that they vibrate and collide with each other vigorously, leading to particle aggregation. As a result, dispersed $SiO_2$ nanoparticles are eventually aggregated and floating on the melt surface. Consequently, the motion of particles is more vigorous in the vertical direction than in the horizontal one, which leads to the deviation of the deposit thickness according to the position and the geometry of substrate in this sense. We found that the introduction of "L-shape" Ag substrate increased the reduction current, and subsequently, the deposit amount, and improved the deposit uniformity. FIG. 7 depicts a schematic diagram of moving silica particle near the substrates with different shape and chronoamperograms at a silver electrode (−1.25 V vs. a QRE) in a 850° C. $CaCl_2$ melt containing a suspension of 0.2 M $SiO_2$ NPs.

Doping Using Co-Deposition

Introduction of dopant to silicon crystal structure is an essential step for the control of silicon electrical properties and conventional dopant diffusion or implantation can be employed for the doping on silicon deposit. Nevertheless, in-situ doping using co-deposition (co-reduction) of secondary oxide enables dopant to be distributed uniformly in silicon and enhances the applicability of the electrochemical silicon production, while obviating a second doping step.

The probable dopant candidates are $Al_2O_3$, $In_2O_3$, $Sb_2O_3$, and $Bi_2O_3$, which would be reduced simultaneously and generate a shallow dopant level inside silicon band gap. FIG. 3 shows that silicon crystals electrodeposited from $SiO_2$ nanoparticles with the addition of secondary oxides, which reveals that the addition did not change the shape and the chemical properties of silicon, except that small amounts of secondary elements remain in the silicon as shown in secondary ion mass spectroscopy analysis.

Figure 8:
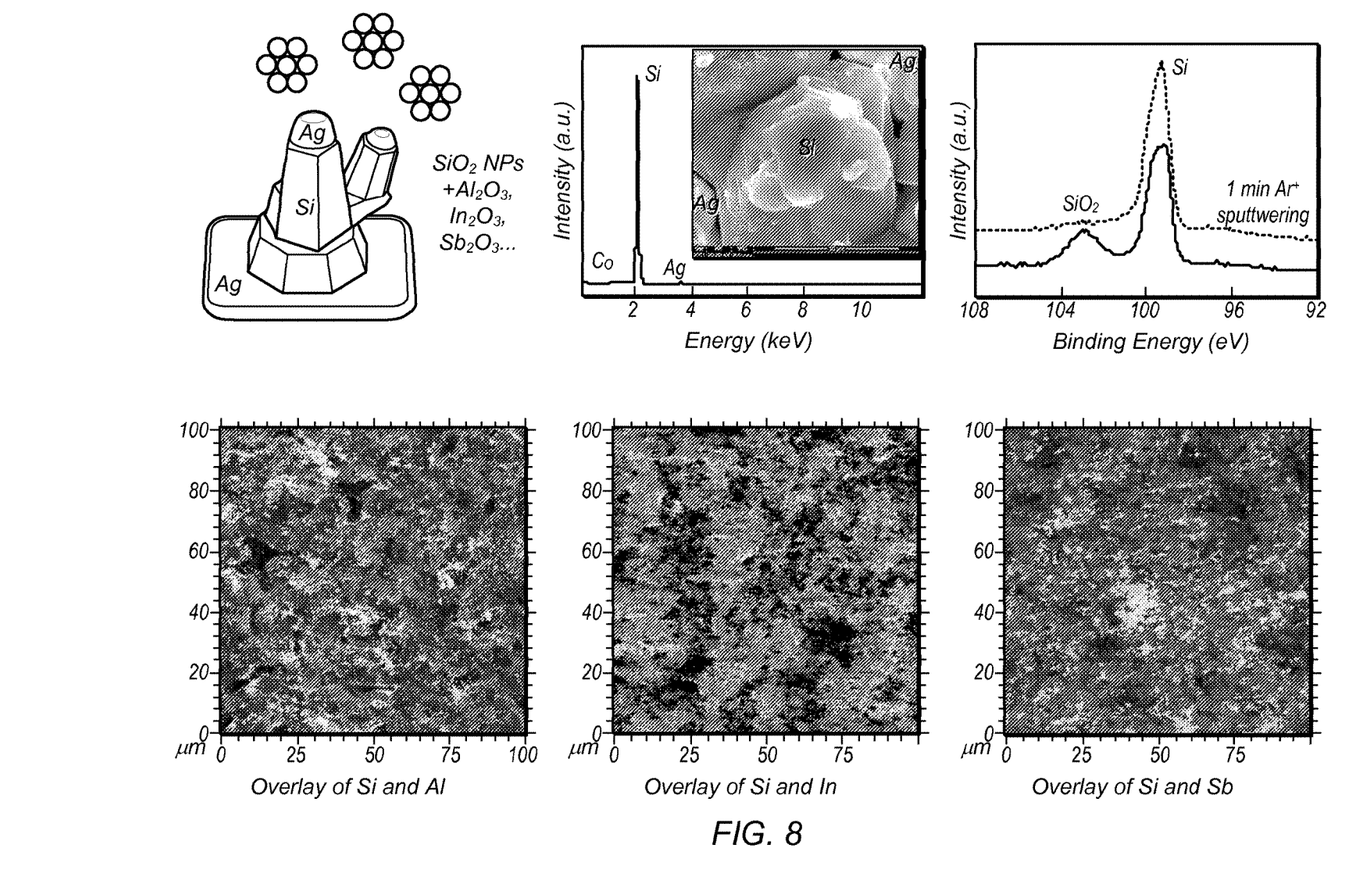
FIG. 8 depicts SEM-EDS and XPS results of silicon crystal electrodeposited with Al$_2$O$_3$, and secondary ion mass spectroscopic elemental mappings of silicon deposit electrodeposited with Al$_2$O$_3$, In$_2$O$_3$, and Sb$_2$O$_3$.

FIG. 8 depicts SEM-EDS and XPS results of silicon crystal electrodeposited with $Al_2O_3$, and secondary ion mass spectroscopic elemental mappings of silicon deposit electrodeposited with $Al_2O_3$, $In_2O_3$, and $Sb_2O_3$.

Figure 9:
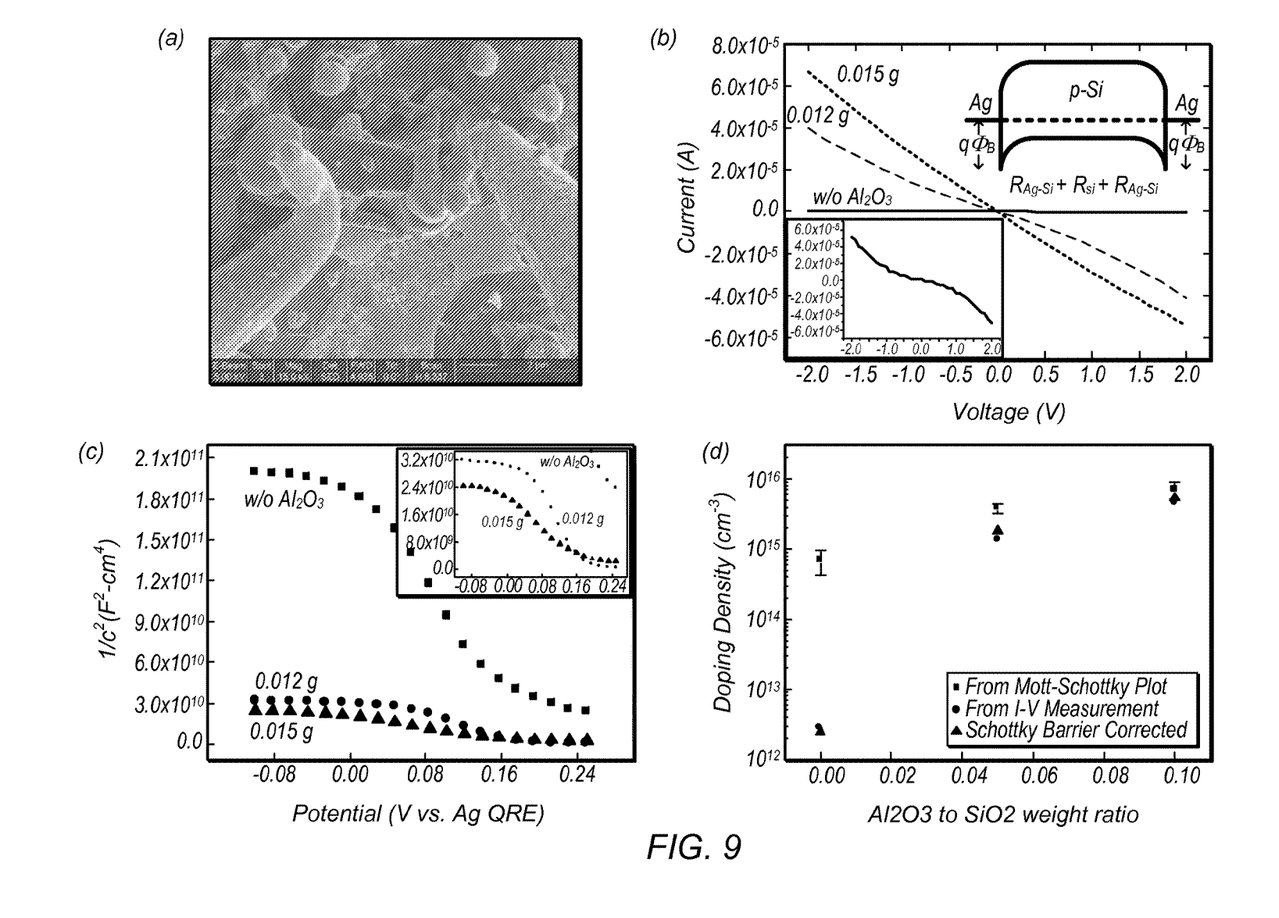

The changes in the electrical properties with the secondary oxides were investigated via I-V measurements and Mott-Schottky plot analysis. I-V behavior of the electrodeposited silicon crystal was measured using micrometer scale tungsten probes contacted on silicon crystal with the current flow. FIG. 9(a) depicts SEM image of silicon crystal probed by tungsten tips and FIG. 9(b) depicts I-V curves measured on silicon crystal with tungsten tips. Silver islands which spontaneously generate on silicon crystal during electrodeposition were used as contact points of the tungsten tip, since it made the better metal-silicon junction compared to the direct contact of tip to silicon crystal (FIG. 9(a)). FIG. 9(b) showed the change in I-V behavior of silicon crystal according to the addition of $Al_2O_3$ during electrodeposition. Obviously, the addition of $Al_2O_3$ made silicon more conductive which is evidence for doping, and the non-linearity of I-V curve originates from a Schottky barrier between silicon and silver. FIG. 9(c) depicts Mott-Schottky plot of silicon crystals measured in acetonitrile which contains 0.1 M $TBAPF_6$ (5333 Hz). The sign of doping was also observed in a Mott-Schottky plot (FIG. 9(c)). The capacitance in the space charge region of silicon is a function of the applied voltage and the change rate is inversely proportional to the doping density. A linear region (0.065~0.139 V vs. Ag QRE) appeared in Mott-Schottky plot, which is obtained in acetonitrile solution and its slope decreased with the addition of $Al_2O_3$, which indicates an increase in the doping density. FIG. 9(d) shows the doping density calculated from each analysis and doping densities are in the range of $10^{15}$ to $10^{16}/cm^3$, and increased with the addition. The estimated values from two different measurements are similar to each other.

Figure 10:
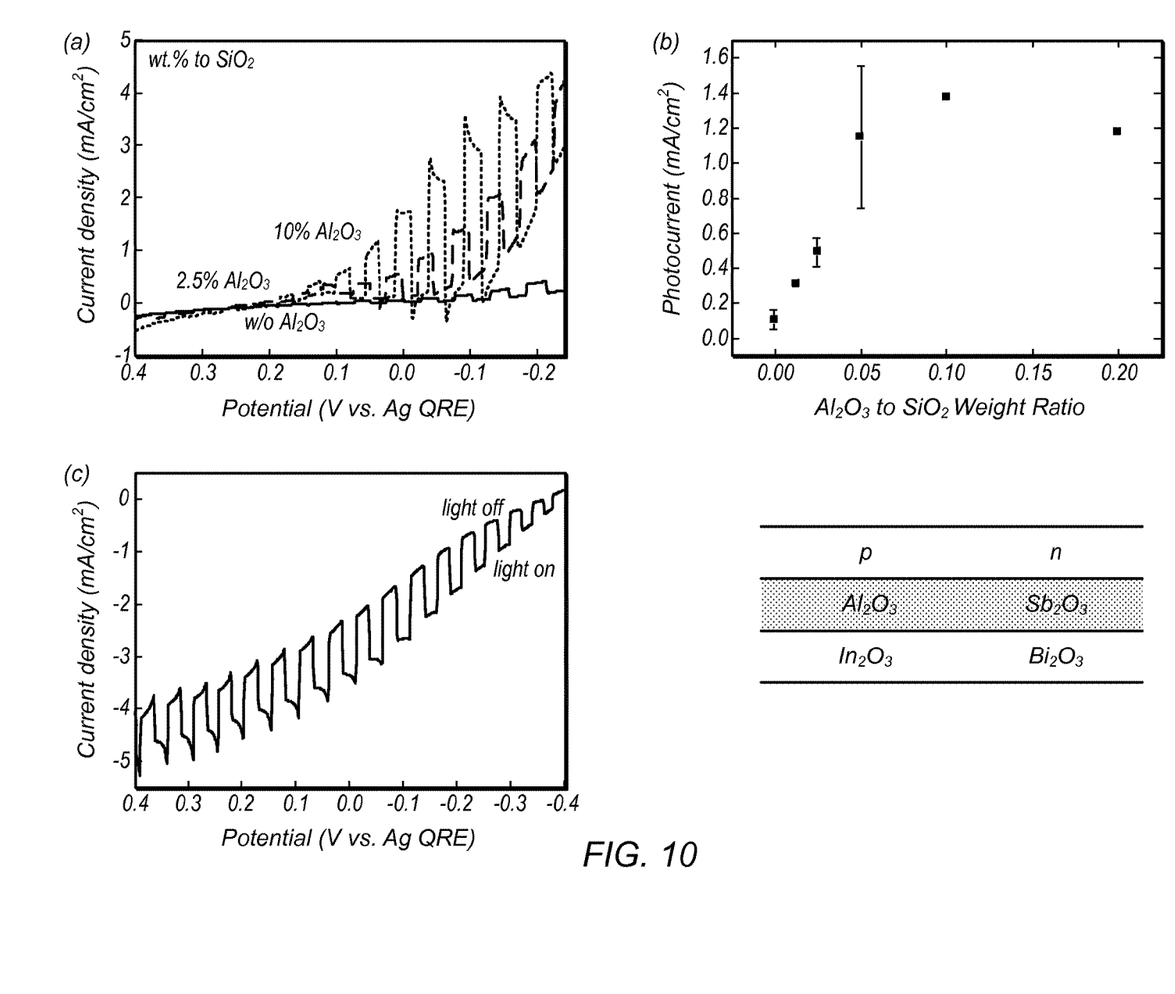
FIG. 10(a) depicts linear sweep voltammograms of silicon deposited with Al$_2$O$_3$ measured in acetonitrile solution containing ethyl viologen with the UV irradiation.
FIG. 10(b) depicts the change in the photocurrents (at −0.1 V vs. Ag QRE) according to the Al$_2$O$_3$ amount.
FIG. 10(c) depicts linear sweep voltammograms of silicon deposited with Bi$_2$O$_3$ measured in acetonitrile solution containing TMPD with the UV irradiation.

The photoactivity and the polarity of silicon deposit electrodeposited with secondary oxides were measured in photoelectrochemical cell equipped with UV-vis light source (Xenon lamp, 100 $mW/cm^2$). FIG. 10(a) depicts linear sweep voltammograms of silicon deposited with $Al_2O_3$ measured in acetonitrile solution containing ethyl viologen with the UV irradiation. FIG. 10(b) depicts the change in the photocurrents (at −0.1 V vs. Ag QRE) according to the $Al_2O_3$ amount. FIG. 10(c) depicts linear sweep voltammograms of silicon deposited with $Bi_2O_3$ measured in acetonitrile solution containing TMPD with the UV irradiation. The photoresponse was dramatically increased by 26 times with the addition of $Al_2O_3$ (FIG. 10(a)). FIG. 10(b) showed the change in the photoresponse gradually increased with the addition of $Al_2O_3$ due to the decrease in the silicon resistivity, followed by the saturation at around 1.3 $mA/cm^2$, which is 14% of the response from single crystalline p-Si wafer (9.29 $mA/cm^2$). It is a practical and noticeable in consideration of the difference in the process steps applied for the formation of silicon between electrodeposition and commercial process. Moreover, the nature (n- or p-) of the silicon can be controlled with the type of secondary oxide material and the addition of $Sb_2O_3$ and $Bi_2O_3$ was found to generate n-type silicon, which exhibited the photo-oxidation of TMPD as shown in FIG. 10(c). It is known that Al and In generate a shallow level near the valence band of silicon, and Sb and Bi generate near the conduction band whereby general principle of silicon doping can be applied to electrochemical codeposition process.

Silicon Deposit with Best Performance

Figure 11:
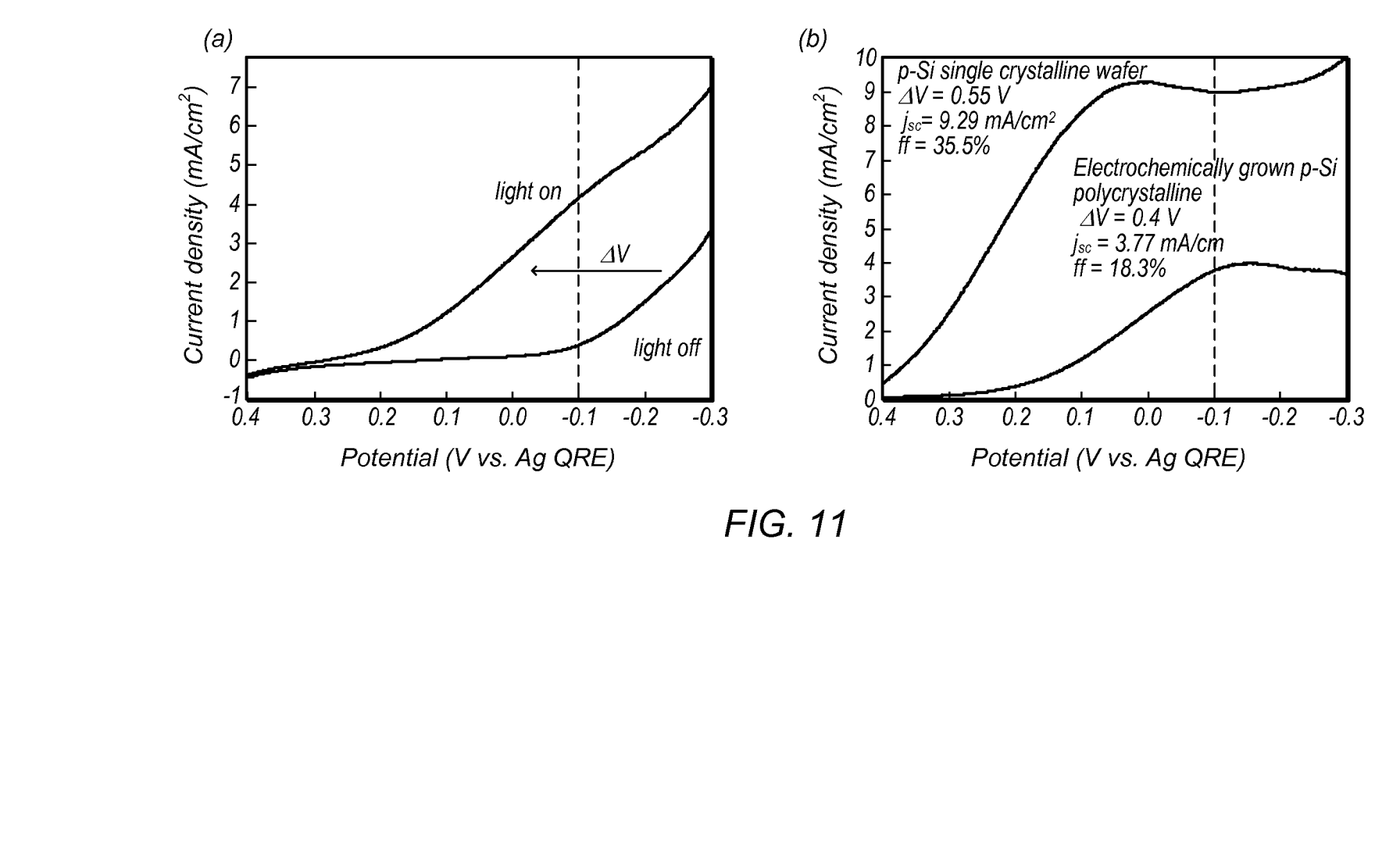
FIG. 11 depicts linear sweep voltammograms of silicon deposited with In$_2$O$_3$ measured in acetonitrile solution containing ethyl viologen with the UV irradiation (a) before and (b) after the subtraction of dark current, in comparison with the response from silicon wafer.

As mentioned above, there is appreciable non-uniformity of the distributions of $SiO_2$ and secondary oxides particles in $CaCl_2$ melt, which induces a substantial difference of its photoactivity. FIG. 11(a) is the photoresponse from In-doped silicon deposit which showed the best performance. FIG. 11(b) is the photocurrent after the subtraction of dark current, originating from the reduction of ethyl viologen on the exposed silver surface, in comparison with single crystalline silicon wafer. Its response is comparable to that from single crystal silicon wafer (40% of the $J_{sc}$). Low performance (low $j_{sc}$ and small fill factor) was assumed to arise from several parasitic resistances in silicon electrode used in photoelectrochemical measurement. One is a series resistance originating from grain boundaries in silicon deposit, which act as a potential barrier in the photogenerated current flow. As the crystal size of silicon deposit is in the range of a few micrometers, its effect would be significant compared to single crystal wafer. The other is a shunt resistance that arises from the direct contact of electrolyte to the underlying silver substrate, which results in a leakage current.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method of producing a silicon film comprising:
    forming a deposition composition by adding silicon dioxide particles to a molten salt to form a dispersion of the silicon dioxide particles in the molten salt;
    placing a silver substrate and a counter electrode in the deposition composition; and
    passing a reducing current between the silver substrate and the counter electrode, wherein the reducing current causes reduction of silicon dioxide particles dispersed in the molten salt to form a silicon film on the silver substrate.

2. The method of claim 1, wherein the silicon dioxide particles are in the form of a colloid of silicon oxide particles in water.

3. The method of claim 1, wherein the silicon dioxide particles have an average diameter of less than 50 µm.

4. The method of claim 1, wherein the silicon dioxide particles have an average diameter of less than 1 µm.

5. The method of claim 1, wherein the molten salt comprises calcium chloride.

6. The method of claim 1, wherein the molten salt comprises a mixture of calcium chloride, lithium chloride, and potassium chloride.

7. The method of claim 1, wherein the molten salt is at a temperature of less than about 1000° C.

8. The method of claim 1, wherein the deposition composition further comprises a boron compound, an arsenic compound, a phosphorus compound, an aluminum compound, an indium compound, an antimony compound, a bismuth compound, or mixtures thereof, and wherein the resulting silicon film is a doped silicon film on the metal substrate.

9. The method of claim 1, wherein the deposition composition comprises aluminum oxide, and wherein passing a reducing current between the silver substrate and the counter electrode, causes reduction of silicon dioxide particles and aluminum oxide to form an aluminum doped silicon film on the silver substrate.

10. The method of claim 1, wherein the deposition composition comprises indium oxide, and wherein passing a reducing current between the silver substrate and the counter electrode, causes reduction of silicon dioxide particles and indium oxide to form an indium doped silicon film on the silver substrate.

11. The method of claim 1, wherein the deposition composition comprises antimony oxide, and wherein passing a reducing current between the silver substrate and the counter electrode, causes reduction of silicon dioxide particles and antimony oxide to form an antimony doped silicon film on the silver substrate.

12. The method of claim 1, wherein the deposition composition comprises bismuth oxide, and wherein passing a reducing current between the silver substrate and the counter electrode, causes reduction of silicon dioxide particles and bismuth oxide to form an bismuth doped silicon film on the silver substrate.

13. The method of claim 1, wherein the counter electrode is a carbon based electrode.

14. A photovoltaic device comprising a silicon film on a silver substrate, wherein the silicon film is produced by the method comprising:
    forming a deposition composition by adding silicon dioxide particles to a molten salt to form a dispersion of the silicon dioxide particles in the molten salt;
    a silver substrate and a counter electrode in the composition; and
    passing a reducing current between the silver substrate and the counter electrode, wherein the reducing current causes reduction of silicon dioxide particles dispersed in the molten salt to form a silicon film on the silver substrate.

15. The device of claim 14, wherein the silicon film has a purity of at least 99.9999%.

16. A method of producing a silicon film comprising:
    forming a deposition composition comprising silicon dioxide particles dispersed in a molten salt such that the dispersed silicon dioxide particles move within the molten salt;
    placing a silver substrate and a counter electrode in the deposition composition; and
    passing a reducing current between the silver substrate and the counter electrode, wherein the reducing current causes reduction of silicon dioxide particles dispersed in the molten salt to form a silicon film on the silver substrate.

17. The method of claim 16, wherein the molten salt comprises calcium chloride.

18. The method of claim 16, wherein the molten salt comprises a mixture of calcium chloride, lithium chloride, and potassium chloride.

19. The method of claim 16, wherein the molten salt is at a temperature of less than about 1000° C.

20. The method of claim 16, wherein the deposition composition further comprises a boron compound, an arsenic compound, a phosphorus compound, an aluminum compound, an indium compound, an antimony compound, a bismuth compound, or mixtures thereof, and wherein the resulting silicon film is a doped silicon film on the metal substrate.

* * * * *